(12) United States Patent
Chen et al.

(10) Patent No.: US 11,081,380 B2
(45) Date of Patent: Aug. 3, 2021

(54) CHIP BONDING DEVICE

(71) Applicant: SHANGHAI MICRO ELECTRONICS EQUIPMENT (GROUP) CO., LTD., Shanghai (CN)

(72) Inventors: Feibiao Chen, Shanghai (CN); Hai Xia, Shanghai (CN); Yuebin Zhu, Shanghai (CN); Hailin Cheng, Shanghai (CN); Xiaoyu Jiang, Shanghai (CN); Lili Zhao, Shanghai (CN); Donghao Zhang, Shanghai (CN)

(73) Assignee: SHANGHAI MICRO ELECTRONICS EQUIPMENT (GROUP) CO., LTD, Shanghai (CN)

( * ) Notice: Subject to any disclaimer, the term of this patent is extended or adjusted under 35 U.S.C. 154(b) by 99 days.

(21) Appl. No.: 16/489,198

(22) PCT Filed: Feb. 27, 2018

(86) PCT No.: PCT/CN2018/077348
§ 371 (c)(1),
(2) Date: Aug. 27, 2019

(87) PCT Pub. No.: WO2018/157780
PCT Pub. Date: Sep. 7, 2018

(65) Prior Publication Data
US 2019/0378741 A1    Dec. 12, 2019

(30) Foreign Application Priority Data
Feb. 28, 2017    (CN) .......................... 201710115106.X

(51) Int. Cl.
*H01L 21/68* (2006.01)
*B65G 47/91* (2006.01)
(Continued)

(52) U.S. Cl.
CPC ............ *H01L 21/681* (2013.01); *B65G 47/91* (2013.01); *H01L 21/67796* (2013.01); *H01L 21/6838* (2013.01); *H01L 21/67092* (2013.01)

(58) Field of Classification Search
CPC ......... H01L 21/67092; H01L 21/67796; H01L 21/681; H01L 21/6838; H01L 24/75; H01L 24/80; B65G 47/91
See application file for complete search history.

(56) References Cited

U.S. PATENT DOCUMENTS 5,501,005 A * 3/1996 Onitsuka ............... B23P 19/001
29/833
6,311,391 B1 11/2001 Fuke et al.
(Continued)

FOREIGN PATENT DOCUMENTS

CN    204289402 U    4/2015
CN    104768702 A    7/2015
(Continued)

OTHER PUBLICATIONS

Translation of CN106373914A, Feb. 1, 2017, CETC Beijing Electronic Equipment Co. Ltd. (Year: 2017).*

*Primary Examiner* — George R Koch
(74) *Attorney, Agent, or Firm* — Muncy. Geissler, Olds & Lowe, P.C.

(57) ABSTRACT

A chip bonding apparatus includes a chip separation unit, a chip alignment unit, a chip bonding unit and a bonding robotic arm unit. The bonding robotic arm unit includes a first bonding robotic arm unit and a second bonding robotic arm unit. The first bonding robotic arm unit includes a first motion stage, a first driver configured to drive the first motion stage and at least one first bonding robotic arm arranged on the first motion stage. The first bonding robotic arm is configured to suck up a chip from the chip separation unit and deliver it to the chip alignment unit. The second (Continued)

bonding robotic arm unit includes a second motion stage, a second driver configured to drive the second motion stage and at least one second bonding robotic arm arranged on the second motion stage.

18 Claims, 10 Drawing Sheets

(51) Int. Cl.
    *H01L 21/677*     (2006.01)
    *H01L 21/683*     (2006.01)
    *H01L 21/67*     (2006.01)

(56) References Cited

U.S. PATENT DOCUMENTS

| | | | |
|---|---|---|---|
| 2005/0210667 A1* | 9/2005 | Yakiyama | H05K 13/089 29/740 |
| 2013/0068823 A1* | 3/2013 | Maki | H01L 21/67144 228/101 |
| 2016/0079199 A1* | 3/2016 | Seok | B23K 1/00 228/102 |
| 2017/0062256 A1* | 3/2017 | Cheung | G01R 31/00 |

FOREIGN PATENT DOCUMENTS

| | | |
|---|---|---|
| CN | 106373914 A | 2/2017 |
| CN | 107134419 A | 9/2017 |
| JP | H11067879 A | 3/1999 |
| JP | 2001035864 A | 2/2001 |
| JP | 2007158102 A | 6/2007 |
| JP | 2009200203 A | 9/2009 |
| JP | 2015103795 A | 6/2015 |
| JP | 2016171106 A | 9/2016 |

* cited by examiner

CHIP BONDING DEVICE

This application is a 371 of PCT/CN2018/077348, filing date Feb. 27, 2018.

TECHNICAL FIELD

The present disclosure relates to a chip bonding device.

BACKGROUND

Flip-chip bonding is an interconnection technique for bonding a chip to a substrate. The bonding can maximize the stacking and integration of chips within a limited space without shrinking their critical dimensions. Additionally, it can reduce the package size of a System on Chip (SoC) package and shorten the lengths of conduction paths therein, thus boosting transmission efficiency of the chip. Compared to wafer-to-wafer (W2W) bonding, chip-to-wafer (C2W) bonding allows a higher yield and lower product cost. It is a target for those in the industry to improve the C2W bonding, so that it will have the advantages of both high bonding accuracy and high yield.

With the development of technology, electronic products tend to be lighter, thinner and smaller. To this end, the use of chip bonding techniques is increased progressively. When combined with a wafer-level packaging process, a chip bonding process is beneficial in fabrications of smaller packages with higher performance. Moreover, a chip bonding process in combination with a through-silicon via (TSV) process makes it possible to manufacture chip structures that are more competitive in terms of cost and performance.

However, the existing bonding techniques require that each single one of the chips are delivered and bonded successively in a one-by-one way, which is unsuitable for mass production in terms of bonding accuracy and yield.

SUMMARY OF THE DISCLOSURE

The present disclosure provides a chip bonding apparatus to solve the problem that the existing bounding apparatus do not meet the requirements of bounding accuracy and yield when bonding chips in massive production.

To solve the technical problems mentioned above, the present disclosure provides technical solutions as follows:

a chip bonding apparatus, comprising a chip separation unit, a chip alignment unit, a chip bonding unit and a bonding robotic arm unit, the bonding robotic arm unit comprising a first bonding robotic arm unit and a second bonding robotic arm unit, the first bonding robotic arm unit comprising a first motion stage, a first driver configured to drive the first motion stage and at least one first bonding robotic arm which is arranged on the first motion stage and configured to suck up a chip from the chip separation unit and deliver it to the chip alignment unit, the second bonding robotic arm unit comprising a second motion stage, a second driver configured to drive the second motion stage and at least one second bonding robotic arm which is arranged on the second motion stage and configured to suck up a chip from the chip alignment unit and deliver it on to the chip bonding unit. The first bonding robotic arm is configured to deliver a chip from the chip separation unit to the chip alignment unit; the second bonding robotic arm is configured to deliver a chip from the chip alignment unit to the chip bonding unit, so that the first bonding robotic arm and the second bonding robotic arm operate independently to each other. A streaming process is established from the chip separation unit to the chip alignment unit and to the chip bonding unit, in which delivery, alignment and bonding of different chips are carried out simultaneously, resulting in time savings in the overall process cycle and an increase in production efficiency.

Preferably, the first motion stage may be implemented as a rotary motion stage, the at least one first bonding robotic arm is arranged circumferentially on the rotary motion stage.

Preferably, the first motion stage may be implemented as a pivotal arm having an output end at which the first bonding robotic arm is mounted.

Preferably, the pivotal arm may be able to pivot in an X-Y plane.

Preferably, the second motion stage may be implemented as a rotary motion stage, the at least one second bonding robotic arm is arranged circumferentially on the rotary motion stage.

Preferably, the chip alignment unit may comprise an alignment measurement system configured to measure a position of a mark on a chip, a third motion stage, a third driver configured to drive the third motion stage and a plurality of measuring suckers arranged on the third motion stage.

Preferably, the alignment measurement system may comprise a chip-down alignment measurement system and/or a chip-up alignment measurement system.

Preferably, the chip-down alignment measurement system may be disposed under the second motion stage and configured to identify a position of a mark on a chip received by one of the at least one second bonding robotic arm from one of the measuring suckers.

Preferably, the chip-up alignment measurement system may be disposed above the third motion stage and configured to identify a position of a mark on a chip on one of the measuring suckers.

Preferably, the third motion stage may be implemented as a rotary motion stage, the measuring suckers are arranged circumferentially on the rotary motion stage.

Preferably, the chip bonding unit may comprise a bonding stage, a bonding tray disposed on the bonding stage and configured to accommodate a bonding substrate and a bonding measurement system configured to measure the position of the bonding substrate.

Preferably, the chip bonding apparatus may further comprise a calibration measurement system configured to measure a reference mark on the third motion stage and a bonding substrate mark on the bonding stage.

Preferably, only one calibration measurement system may be included and disposed between adjacent two of the at least one second bonding robotic arm on the second motion stage. Alternatively, the calibration measurement system is same as the at least one second bonding robotic arm in number, and the calibration measurement systems and the second bonding robotic arms are disposed alternately on the second motion stage.

Preferably, the calibration measurement system and the chip-up alignment measurement system is integrated into the calibration measurement system, so that when moving to a position above one of the measuring suckers, the calibration measurement system acts as the chip-up alignment measurement system to identify a position of a mark on a chip on the measuring sucker.

Preferably, the chip separation unit may comprise a workpiece motion stage, a workpiece tray disposed on the workpiece motion stage, a vertical robotic arm configured to separate a chip from the workpiece tray, and a separation measurement system configured to measure the position of the chip.

Preferably, the chip bonding apparatus may further comprise, when in a chip-down configuration, a flipping robotic arm configured to flip over a chip together with a mark thereon.

Preferably, the flipping robotic arm may be implemented as a vertical flipping robotic arm that is disposed between the chip separation unit and the first bonding robotic arm and is configured to pick up a chip from the chip separation unit, flip the chip over and deliver it on to the first bonding robotic arm.

Preferably, the flipping robotic arm may comprise a pair of pivotal arms both disposed above the chip alignment unit. One of the pivotal arms may be configured to pick up a chip from the chip alignment unit and deliver it to the other pivotal arm, thereby flipping over the chip, while the other pivotal arm may be configured to deliver the flipped chip to the chip alignment unit.

Compared with the prior art, the present disclosure produces the following advantages: the chip bonding apparatus is capable of delivering chips in a continuous manner in which chip delivery, chip alignment and chip bonding can be performed simultaneously, resulting in time savings in the overall process cycle and an increase in yield; moreover, the chip bonding apparatus can bond chips to a single substrate in two modes that are chip-up mode and chip-down mode, which expends the scope of its applicability.

Figure 1:
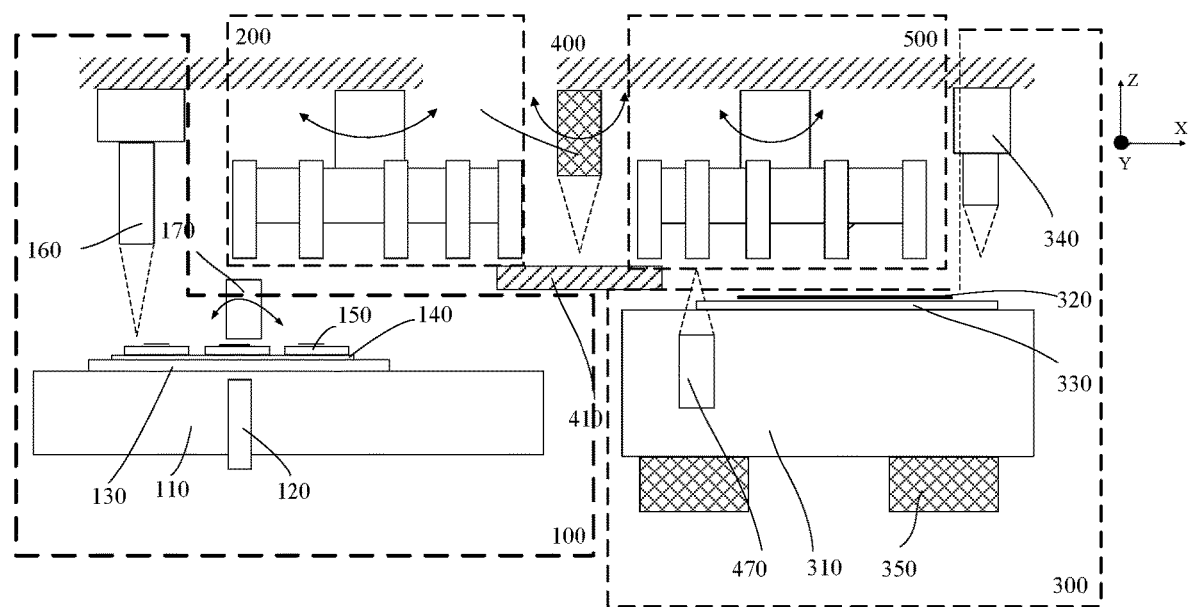
FIG. 1 is a front view of a chip bonding apparatus according to a first embodiment of the present disclosure.
Figure 2:
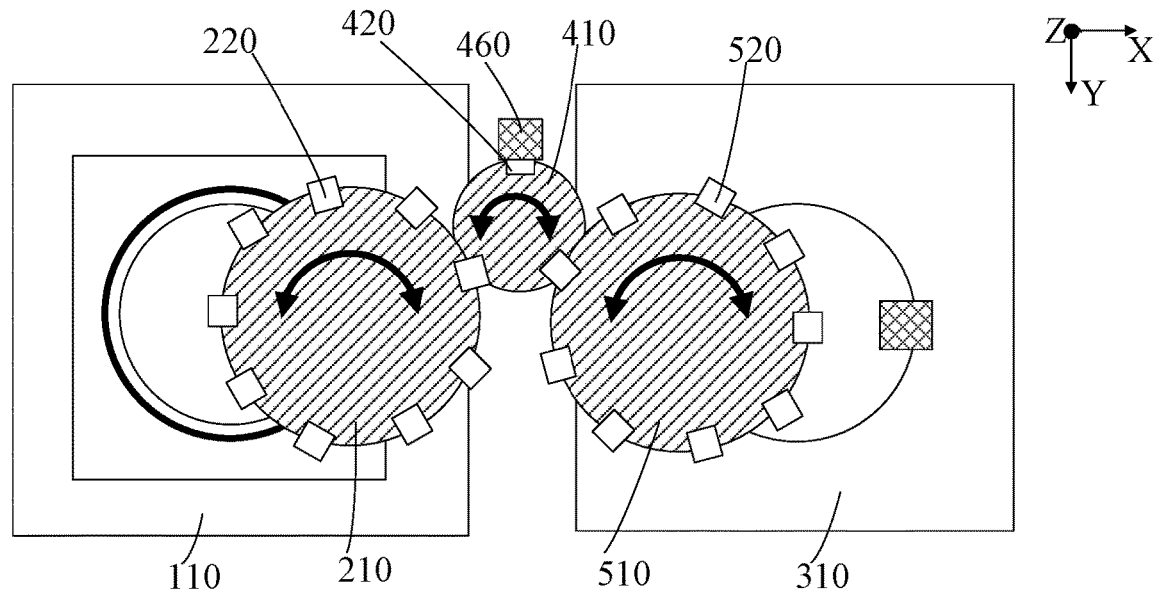
FIG. 2 is a top view of the chip bonding apparatus according to the first embodiment of the disclosure.

In the figures, 100 denotes a chip separation unit; 110 denotes a workpiece motion stage; 120 denotes a vertical robotic arm; 130 denotes a workpiece tray; 140 denotes a chip carrier; 150 denotes a chip; 160 denotes a separation measurement system; 170 denotes a flipping robotic arm; 170a denotes a pivotal arm; 170b denotes a pivotal arm; 200 denotes a first bonding robotic arm unit; 210 denotes a first motion stage; 220 denotes a first bonding robotic arm; 230 denotes a first driver; 240 denotes a first motion stage support; 300 denotes a chip bonding unit; 310 denotes a bonding stage; 320 denotes a bonding substrate; 330 denotes a bonding tray; 340 denotes a bonding measurement system; 350 denotes a damping system; 400 denotes a chip alignment unit; 410 denotes a third motion stage; 420 denotes a measuring sucker; 430 denotes a third driver; 440 denotes a third motion stage support; 460 denotes a chip-up alignment measurement system; 470 denotes a chip-down alignment measurement system; 500 denotes a second bonding robotic arm unit; 510 denotes a second motion stage; 520 denotes a second bonding robotic arm; 530 denotes a second driver; 540 denotes a second motion stage support; and 600 denotes a calibration measurement system.

DETAILED DESCRIPTION

The above objects, features and advantages of the present disclosure will become more apparent and better understood from the following detailed description of a few specific embodiments thereof, which is to be read in connection with the accompanying drawings. Note that the figures are provided in a very simplified form not necessarily presented to scale, with the only intention of facilitating convenience and clarity in explaining the disclosed embodiments.

Embodiment 1

Referring to FIGS. 1 to 6, a chip bonding apparatus includes a chip separation unit 100, a chip alignment unit 400, a chip bonding unit 300 and a bonding robotic arm unit. The bonding robotic arm unit includes a first bonding robotic arm unit 200 and a second bonding robotic arm unit 500. The first bonding robotic arm unit 200 includes a first motion stage 210, a first driver 230 configured to drive the first motion stage 210 and at least one first bonding robotic arm 220 arranged on the first motion stage 210, wherein more than one first bonding robotic arms 220 are arranged on the first motion stage 210 according to the embodiments disclosed herein. The first bonding robotic arms 220 are each configured to suck up a chip from the chip separation unit 100 and deliver it onto the chip alignment unit 400. The second bonding robotic arm unit 500 includes a second motion stage 510, a second driver 530 configured to drive the second motion stage 510 and at least one second bonding robotic arm 520 arranged on the second motion stage 510, wherein more than one second bonding robotic arms 520 are arranged on the second motion stage 510 according to the embodiments disclosed herein. The second bonding robotic arms 520 are each configured to suck up a chip from the chip alignment unit 400 and deliver it onto the chip bonding unit 300. The first bonding robotic arm unit 200 is configured to deliver a chip from the chip separation unit 100 to the chip alignment unit 400; the second bonding robotic arm 500 is configured to deliver a chip from the chip alignment unit 400 to the chip bonding unit 300, so that the first bonding robotic arm unit 200 and the second bonding robotic arm unit 500 operate independently to each other. A streaming process is established from the chip separation unit 100 to the chip alignment unit 400 and to the chip bonding unit 300, in which delivery, alignment and bonding of different chips are carried out simultaneously, resulting in time savings in the overall process cycle and an increase in production efficiency.

In this embodiment, the first motion stage 210 may be implemented as a rotary motion stage on which the first bonding robotic arms 220 are arranged circumferentially. Similarly, the second motion stage 510 may be implemented as a rotary motion stage on which the second bonding robotic arms 520 are arranged circumferentially. In this embodiment, both the first and second motion stages 210, 510 may be rotatable in an X-Y (i.e., horizontal) plane.

Figure 3:
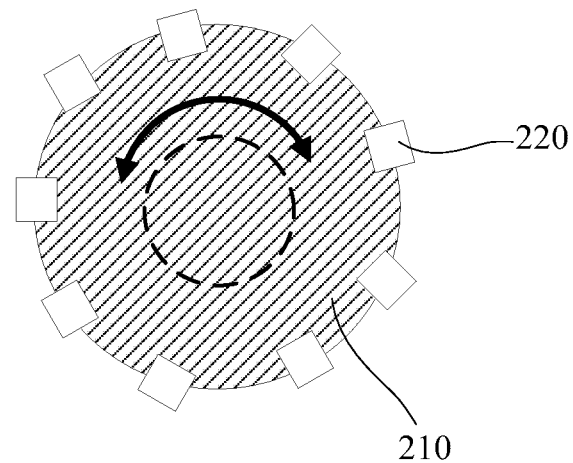
FIG. 3 is a top view of a first motion stage according to the first embodiment of the disclosure.
Figure 4:
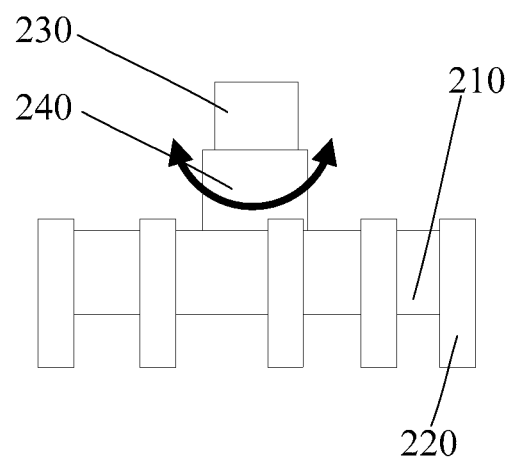
FIG. 4 is a front view of the first motion stage according to the first embodiment of the disclosure.
Figure 5:
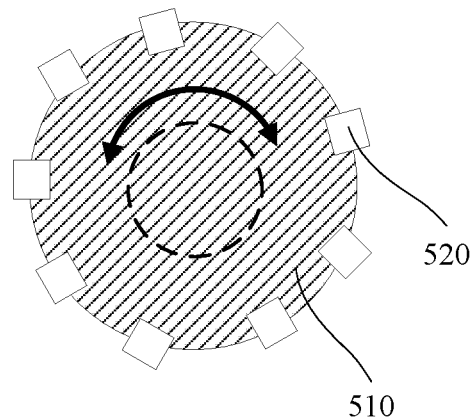
FIG. 5 is a top view of a second motion stage according to the first embodiment of the disclosure.
Figure 6:
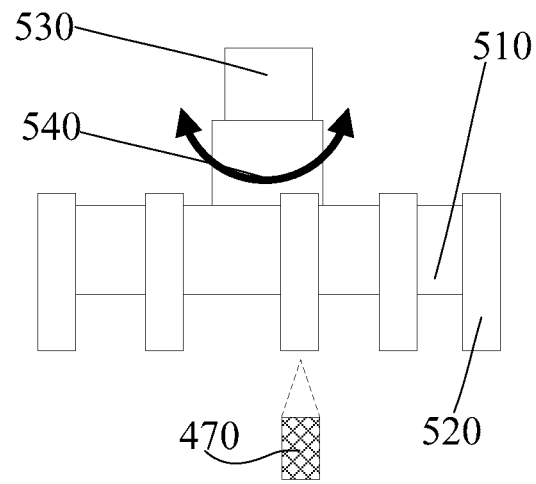
FIG. 6 is a front view of the second motion stage according to the first embodiment of the disclosure.

Referring to FIGS. 3 and 4, the first bonding robotic arm unit 200 may further include a first motion stage support 240, on which the first motion stage 210 is disposed. The first motion stage support 240 supports the first motion stage 210 and connects to the first driver 230 so that the first driver 230 is able to drive the first motion stage support 240 to enable the motions of the first motion stage 210. The first driver 230 is configured to drive the first motion stage 210 to move the first bonding robotic arms 220. Referring to FIGS. 5 and 6, the second bonding robotic arm unit 500 may further include a second motion stage support 540, on which the second motion stage 510 is disposed. The second motion stage support 540 supports the second motion stage 510 and connects to the second driver 530 so that the second driver 530 is able to drive the second motion stage support 540 to enable the motions of the second motion stage 510. The second driver 530 is configured to drive the second motion stage 510 to move the second bonding robotic arms 520.

Figure 7:
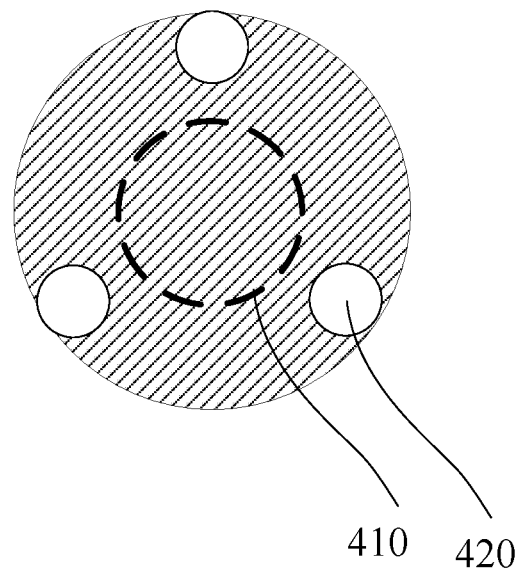
FIG. 7 is a top view of a third motion stage according to the first embodiment of the disclosure.
Figure 8:
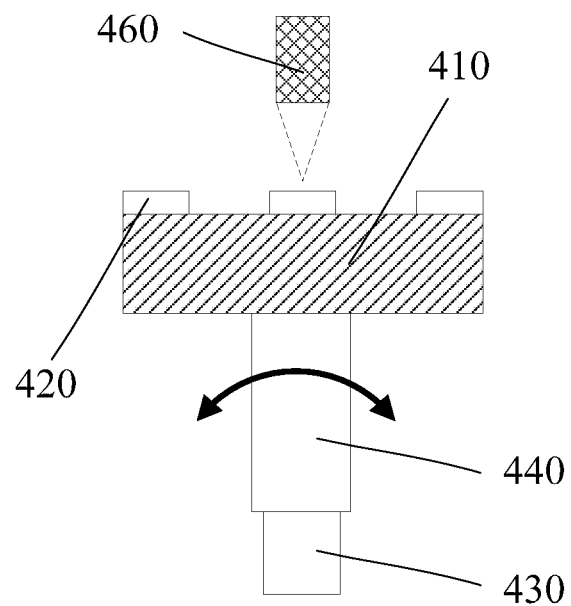
FIG. 8 is a front view of the third motion stage according to the first embodiment of the disclosure.

Referring to FIGS. 1, 7 and 8, the chip alignment unit 400 may include an alignment measurement system configured to measure a mark on a chip, a third motion stage 410, a third driver 430 configured to drive the third motion stage 410 and a plurality of measuring suckers 420 disposed on the third motion stage 410. The chip may be boned with the surface on which a mark locates facing downward and the mark facing toward a bonding substrate, ("chip-down"), or may be boned with the surface on which a mark locates facing upward and the mark facing away from the bonding substrate ("chip-up"). The alignment measurement system may include a chip-down alignment measurement system 470 and a chip-up alignment measurement system 460. One of the chip-down alignment measurement system 470 and the chip-up alignment measurement system 460 may be selected to measure the location of the mark on the chip, based on the orientation of the mark on the chip. The chip-down alignment measurement system 470 may be disposed under the second motion stage 510 so as to be able to measure a mark on a chip received by the second bonding robotic arms 520 from the measuring suckers 420, as shown in FIG. 6. The chip-up alignment measurement system 460 may be disposed above the third motion stage 410 so as to be able to measure a mark of a chip on one of the measuring suckers 420, as shown in FIG. 8. In this embodiment, the third motion stage 410 may be implemented as a rotary motion stage on which the measuring suckers 420 are arranged circumferentially. The third motion stage 410 may be alternatively implemented as another type of motion stage, such as for example, a linear reciprocating motion stage.

The chip alignment unit 400 may further include a third motion stage support 440, on which the third motion stage 410 is disposed. The third motion stage support 440 supports the third motion stage 410 and connects the third driver 430 so that the third driver 430 is able to drive the third motion stage support 440 to enable the motions of the third motion stage 410. The third driver 430 is configured to drive the third motion stage 410 to move the measuring suckers 420.

Referring to FIG. 1, the chip separation unit 100 may include a workpiece motion stage 110, a workpiece tray 130 disposed on the workpiece motion stage 110, a chip carrier 140 placed in the workpiece tray 130, a vertical robotic arm 120 configured to separate a chip from the chip carrier 140 and a separation measurement system 160 configured to measure the position of the chip. The workpiece motion stage 110 may be configured to drive the workpiece tray 130 to move so that the chip carrier 140 will move along with the workpiece tray 130. In this embodiment, in the chip-up configuration, the first bonding robotic arms 220 may each directly suck up a chip from the chip separation unit 100 and deliver it onto the chip alignment unit 400. In the chip-down configuration, a flipping robotic arm 170 for sucking up and flipping over a chip may be additionally arranged between the first bonding robotic arms 220 and the chip carrier 140. In this embodiment, the flipping robotic arm 170 may be implemented as a vertical flipping robotic arm with a single pivotal arm, which is capable of picking up a chip from the chip carrier 140, flipping it over 180° and handing it over to one of the first bonding robotic arms 220.

Referring to FIG. 1, the chip bonding unit 300 may include a bonding stage 310, a bonding tray 330 disposed on the bonding stage 310 and configured to accommodate a bonding substrate 320, and a bonding measurement system 340 for measuring the position of the bonding substrate 320.

In the embodiments disclosed herein, the working positions of the first bonding robotic arm unit 200 (including all possible positions that the first bonding robotic arms 220 of the first bonding robotic arm unit 200 can move to), the working positions of the chip alignment unit 400 (including all possible positions that the measuring suckers 420 can move to), the working positions of the second bonding robotic arm unit 500 (including all possible positions that the second bonding robotic arms 520 of the second bonding robotic arm unit 500 can move to), and the working positions of the chip bonding unit 300 (including a position where it stands by for bonding) are in coordination with one another to facilitate the delivery of a chip from the chip separation unit 100, to the first bonding robotic arm unit 200, to the chip alignment unit 400, to the second bonding robotic arm unit 500, and to the chip bonding unit 300. Specifically, this can be accomplished by properly designing the sizes of the first motion stage 210, the third motion stage 410 and the second motion stage 510 or the positions of the first bonding robotic arms 220 on the first motion stage 210, the measuring suckers 420 on the third motion stage 410 and the second bonding robotic arms 520 on the second motion stage 510.

A chip bonding method performed by using the chip bonding apparatus as defined above in its chip-up configuration will be described below.

In step U1, as shown in FIG. 1, the chip carrier 140 is fixed onto the workpiece tray 130 of the workpiece motion stage 110, and then the separation measurement system 160 determines the position of the chip carrier 140. The workpiece motion stage 110 drives the workpiece tray 130 to move the chip carrier 140 on which chips 150 to be picked up are supported until the chip carrier 140 is located above the vertical robotic arm 120. The vertical robotic arm 120 moves upward and raises one of the chips 150, a corresponding one of the first bonding robotic arms 220 on the first motion stage 210 sucks up a chip 150 by vacuum (i.e., the first one of the first bonding robotic arms 220 sucks up the first one of the chips 150), and then the vertical robotic arm 120 moves back to its original position.

In step U2, the first motion stage 210 rotates so that the first bonding robotic arm 220 holding the chip 150 moves therewith and approaches the third motion stage 410 and delivers the chip 150 to one of the measuring suckers 420 (i.e., a first one of the first bonding robotic arms 220 that is holding a first one of the chips 150 delivers the chip 150 onto one of the measuring suckers 420). At the same time, another one of the first bonding robotic arms 220 may sucks up another one of the chips 150 (i.e., a second one of the first bonding robotic arms 220 sucks up a second one of the chips 150) from the chip separation unit 100.

In step U3, the third motion stage 410 rotates so that the measuring sucker 420 holding the chip 150 (i.e., the first one of the chips 150) moves therewith to deliver the chip 150 (i.e., the first one of the chips 150) to the chip-up alignment measurement system 460, and then the chip-up alignment measurement system 460 measures the position of a mark on this chip 150. At the same time, the another one of the first bonding robotic arms 220, on which the another one of the chips 150 is held, is rotated to deliver the chip 150 to the third motion stage 410 (i.e., the second one of the first bonding robotic arms 220 that is holding the second one of the chips 150 delivers the second one of the chips 150 onto the third motion stage 410), and another one of the measuring suckers 420 sucks the chip 150 by vacuum. Concurrently, another one of the first bonding robotic arms 220 may sucks up a chip 150 (i.e., the first one of the first bonding robotic arms 220 sucks up a third one of the chips 150, or one of the first bonding robotic arms 220 other than the first and second one sucks up a third one of the chips 150) from the chip separation unit 100.

In step U4, the third motion stage 410 rotates so that the measuring sucker 420 holding the aligned chip 150 (i.e., the first one of the chips 150) moves therewith to deliver the chip 150 (i.e., the first one of the chips 150) to the second motion stage 510, and a corresponding one of the second bonding robotic arms 520 sucks up by vacuum the chip 150 (i.e., the first one of the chips 150). At the same time, the another one of the measuring suckers 420 that is holding the chip 150 (i.e., the second one of the chips 150) moves to deliver the second one of the chips 150 onto the chip-up alignment measurement system 460, and then the chip-up alignment measurement system 460 measures the position of a mark on the second one of the chips 150. Currently, the first bonding robotic arm 220 holding the third one of the chips 150 moves to deliver the third one of the chips 150 to the third motion stage 410 and still another one of the measuring suckers 420 sucks the third one of the chips 150. Meanwhile, a further one of the first bonding robotic arms 220 sucks up a further one of the chips 150 (i.e., the one of the first bonding robotic arms 220 which has previously sucked up a chip and is idle at this moment sucks up a fourth one of the chips 150, or one of the first bonding robotic arms 220 other than the previously four sucks up a fourth one of the chips 150) from the chip separation unit 100.

In step U5, the second motion stage 510 rotates so that one of the second bonding robotic arms 520 moves therewith to deliver the first one of the chips 150 to a working position for bonding of the chip bonding unit 300, concurrently, the third motion stage 410 rotates so that the measuring sucker 420 holding the second one of the chips 150 which has been aligned moves therewith to deliver the second one of the chips 150 to the second motion stage 510, and another one of the second bonding robotic arms 520 sucks up the second one of the chips 150. At the same time, the measuring sucker 420 holding the third one of the chips 150 moves to deliver the second one of the chips 150 to the chip-up alignment measurement system 460, and then the chip-up alignment measurement system 460 measures the position of a mark on the third one of the chips 150, and a further one of the measuring suckers 420 picks up the fourth one of the chips 150 from one of the first bonding robotic arms 220, in other words, the first motion stage 210 rotates to allow the first bonding robotic arm 220 holding the fourth one of the chips 150 to deliver the fourth one of the chips 150 onto the third motion stage 410. Concurrently, a further one of the first bonding robotic arms 220 sucks up a further one of the chips 150 (i.e., the one of the first bonding robotic arms 220 which has previously sucked up a chip and is idle at this moment sucks up a fifth one of the chips 150, or one of the first bonding robotic arms 220 other than the previously five sucks up a fifth one of the chips 150) from the chip separation unit 100. As can be readily seen from the above description, throughout the chip bonding process, a plurality of chips 150 may be handled simultaneously in different phases of the process including delivery, alignment and bonding. This can shorten the process cycle time and enhance production efficiency.

After the bonding substrate 320 is fixed to the bonding tray 330 on the bonding stage 310, bonding measurement system 340 determines the position of the bonding substrate 320. The bonding stage 310 then transports the bonding substrate 320 to a working position for bonding. At this point, the second bonding robotic arm 520 holding the chip 150 also moves to the working position for bonding. The bonding measurement system 340 may also be configured to confirm the position where the chip 150 is to be bonded onto the bonding substrate 320. After that, the chip 150 may be bonded onto the bonding substrate 320. The bonding substrate 320 may arrive at the working position for bonding simultaneously with, prior to or subsequent to the arrival of the chip 150 at the working position for bonding.

In step U6, steps U1 to U5 may be repeated.

A chip bonding method performed by using the chip bonding apparatus as defined above in its chip-down configuration will be described below.

In step D1, the vertical robotic arm 120 moves upward to lift one of the chips (here, a first one of the chips 150), and the flipping robotic arm 170 sucks up the first one of the chips 150 and rotates. Subsequently, one of the first bonding robotic arms 220 sucks up by vacuum the first one of the chips 150 from the flipping robotic arm 170. In order not to change the structure of the chip bonding unit 300, in the chip-down configuration, the chip separation unit 100 is adjusted in height so that the first bonding robotic arms 220 can suck up the chips 150 properly, and all the first bonding robotic arms 220 are at a same height.

In step D2, the first motion stage 210 rotates so that the first bonding robotic arm 220 holding the first one of the chips 150 moves therewith to deliver the first one of the chips 150 onto one of the measuring suckers 420 on the third motion stage 410. At the same time, another one of the first bonding robotic arms 220 sucks up another one of the chips 150 (i.e., a second one of the chips 150) from the chip separation unit 100.

In step D3, the third motion stage 410 rotates so that the measuring sucker 420 moves therewith to deliver the first one of the chips 150 to one of the second bonding robotic arms 520. At the same time, the first motion stage 210 rotates so that another one of the first bonding robotic arms 220 moves therewith to deliver another one of the chips 150 (i.e., the second one of the chips 150) to another one of the measuring suckers 420, and another one of the first bonding robotic arms 220 sucks up another one of the chips 150 (i.e., the third one of the chips 150) from the chip separation unit 100.

In step D4, the second motion stage 510 rotates so that one of the second bonding robotic arms 520 holding the first one of the chips 150 moves therewith and approaches the chip-down alignment measurement system 470, and then the chip-down alignment measurement system 470 measures the position of a mark on the first one of the chips 150, and another one of the second bonding robotic arms 520 sucks up the second one of the chips 150 from the measuring sucker 420. At the same time, the first motion stage 210 rotates so that the first bonding robotic arm 220 moves therewith to deliver the third one of the chips 150 to another one of the measuring suckers 420, and a further one of the first bonding robotic arms 220 sucks up a further one of the chips 150 (i.e., the fourth one of the chips 150) from the chip separation unit 100.

In step D5, the second motion stage 510 rotates so that the second bonding robotic arm 520 moves therewith to deliver the first one of the chips 150 which has been aligned to a working position for bonding. At this point, with the bonding substrate 320 having been fixed to the bonding tray 330 on the bonding stage 310, the bonding measurement system 340 determines the position of the bonding substrate 320, and the bonding stage 310 transports the bonding substrate 320 to the working position for bonding. Following that, the first one of the chips 150 is bonded onto the bonding substrate 320, and the another one of the second bonding robotic arms 520 holding the second one of the chips 150 moves to the chip-down alignment measurement system 470, and then the chip-down alignment measurement system 470 measures the position of a mark on the second one of the chips 150. At the same time, the third motion stage 410 rotates so that one of the measuring sucker 420 hands over the third one of the chips 150 to the second bonding robotic arm 520, while the first motion stage 210 rotates so that one of the first bonding robotic arms 220 moves to deliver the fourth one of the chips 150 to another one of the measuring suckers 420. Additionally, another one of the first bonding robotic arms 220 sucks up a further one of the chips 150 (i.e., the fifth one of the chips 150) from the chip separation unit 100.

In step D6, steps D1 to D5 may be repeated.

As shown in FIG. 1, the chip alignment unit 400, second bonding robotic arm unit 500 and chip bonding unit 300 may be equipped with a damping system 350 in order to enhance chip bonding accuracy.

Embodiment 2

Figure 9:
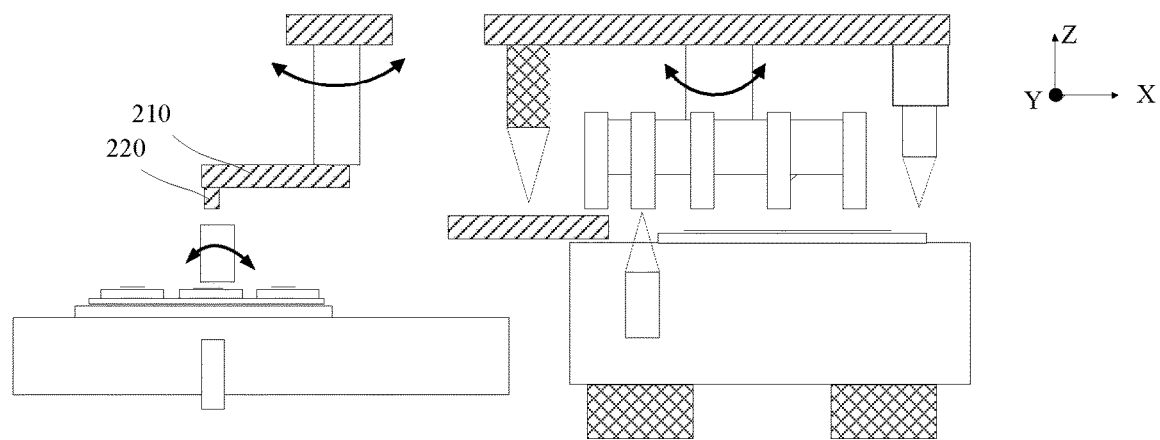
FIG. 9 is a front view of a chip bonding apparatus according to a second embodiment of the present disclosure.
Figure 10:
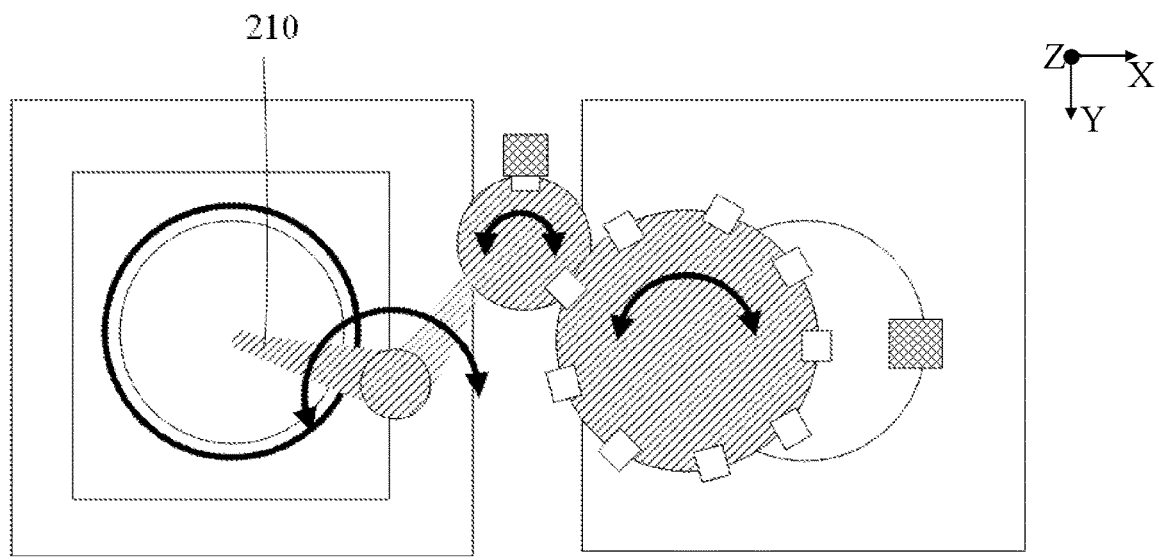
FIG. 10 is a top view of the chip bonding apparatus according to the second embodiment of the disclosure.

As shown in FIGS. 9 and 10, this embodiment differs from Embodiment 1 in that the first motion stage 210 is implemented as a pivotal arm configured to be able to pivot in an X-Y plane (i.e., horizontally), and only one first bonding robotic arm 220 is mounted at an output end of the pivotal arm. During chip bonding, the pivotal arm may be controlled so that the time the pivotal arm takes for a pivoting cycle is equal to the time that one of the measuring suckers 420 takes for a switch of its working position. Here, the "pivoting cycle" can be understood as a complete process in which one of the first bonding robotic arms 220 moves form the working position for handing over the chips from one of the measuring suckers 420 to the chip separation unit 100, and sucks up a chip and carry the chip back to the working position. The time that one of the measuring suckers 420 takes for a switch of working position can be understood as the time consumption in the position change of the one of the measuring suckers 420 along with the rotation of the third motion stage 410 from its current working position to another working position at which an adjacent one of the measuring suckers 420 currently is, i.e., the time consumption in the position change of the next (idle) one of the measuring suckers 420 to the working position for chip handover.

Embodiment 3

Figure 11:
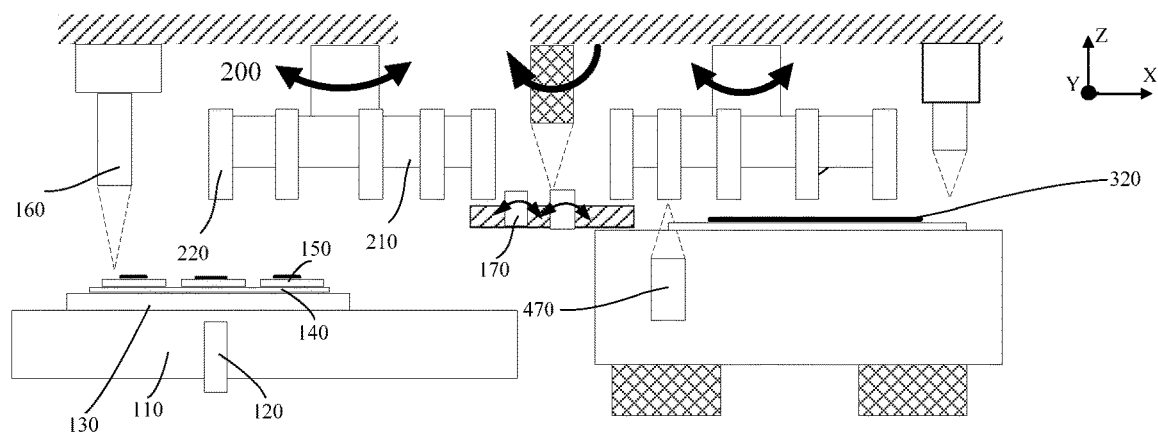
FIG. 11 is a front view of a chip bonding apparatus according to a third embodiment of the present disclosure.
Figure 12:
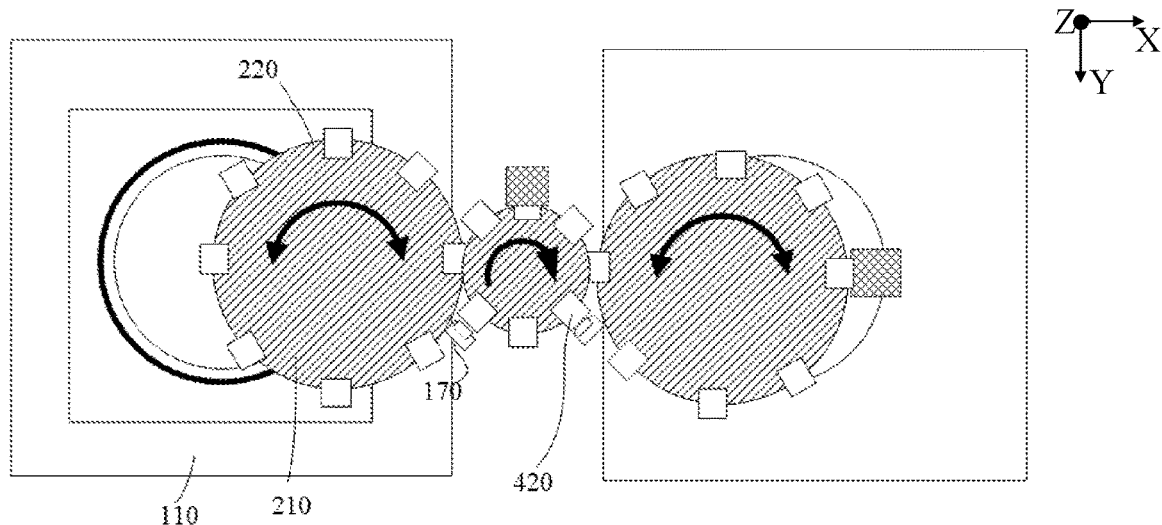
FIG. 12 is a top view of the chip bonding apparatus according to the third embodiment of the disclosure.
Figure 13:
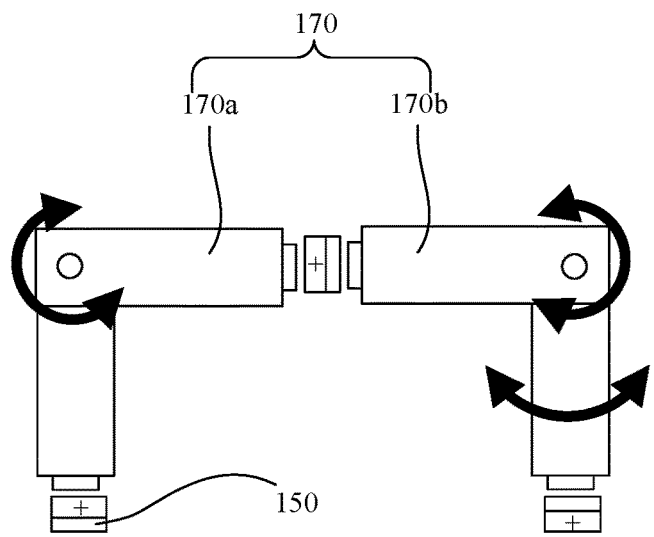
FIG. 13 is a schematic illustration of a flipping robotic arm according to the third embodiment of the disclosure.
Figure 14:
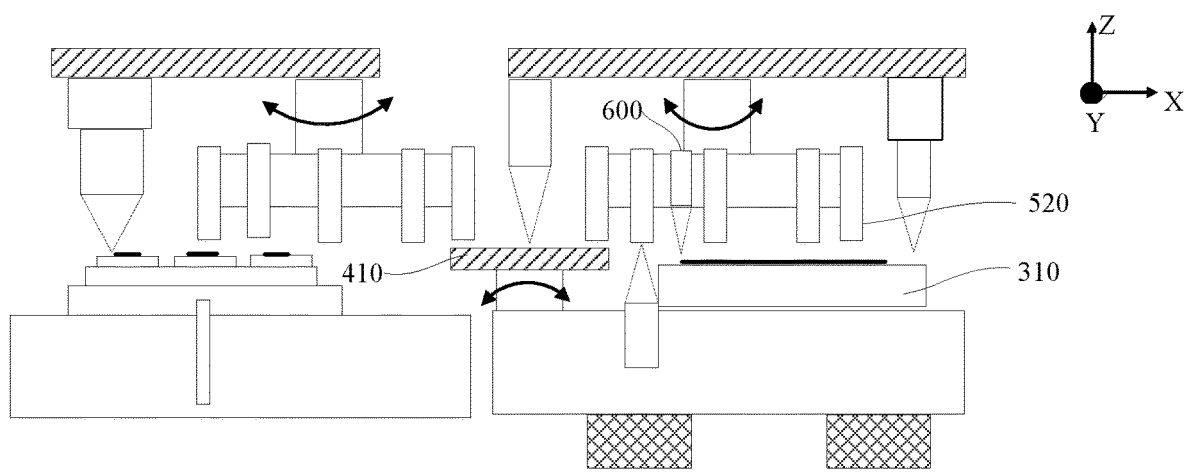
FIG. 14 is a front view of a chip bonding apparatus according to a fourth embodiment of the present disclosure.
Figure 15:
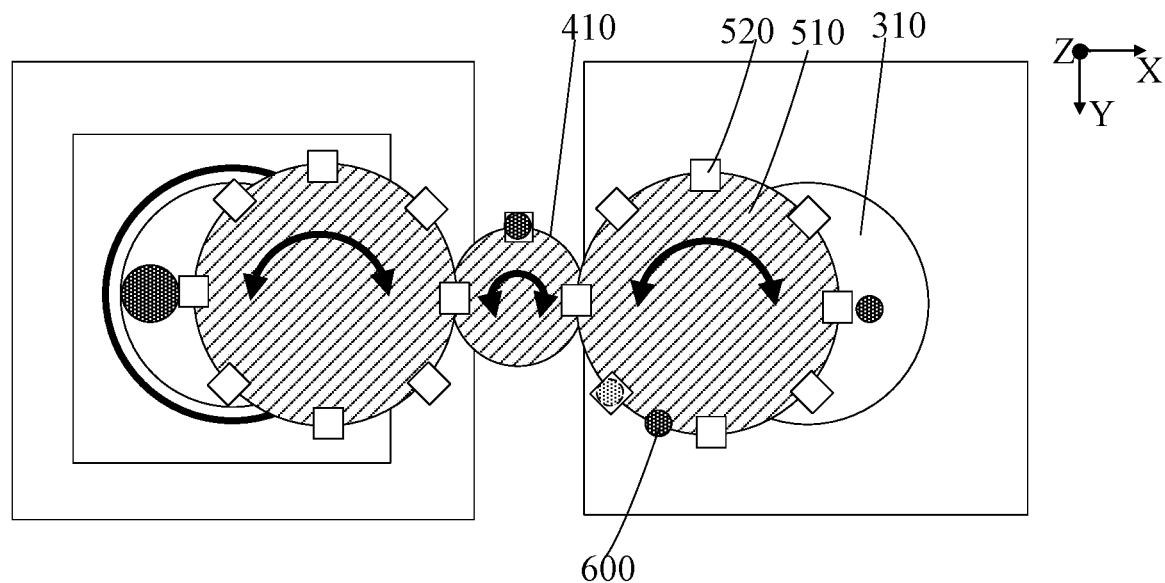
FIG. 15 is a top view of a chip bonding apparatus according to the fourth embodiment of the disclosure.
Figure 16:
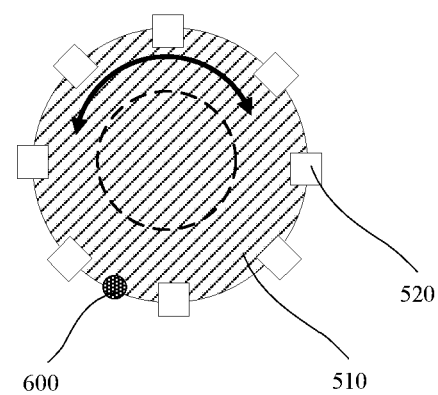
FIG. 16 is a top view of a second motion stage according to the fourth embodiment of the disclosure.
Figure 17:
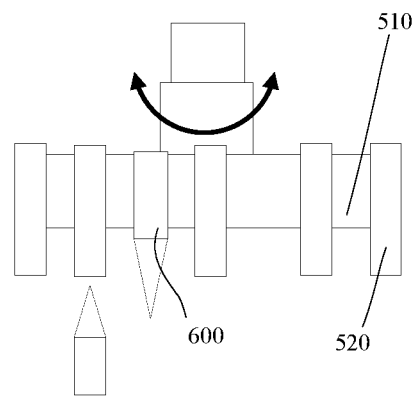
FIG. 17 is a front view of the second motion stage according to the fourth embodiment of the disclosure.

As shown in FIGS. 11 to 13, this embodiment differs from Embodiment 1 in that, in both the chip-up and chip-down configurations, the first bonding robotic arms 220 directly sucks up chips from the chip separation unit 100 and delivers them to the chip alignment unit 400. In the chip-down configuration, the flipping robotic arm 170 is located above the chip alignment unit 400. In this embodiment, the flipping robotic arm 170 may include a pair of pivotal arms. Specifically, in the chip-down configuration, the chip bonding is carried out as follows: after the chip carrier 140 is fixed to the workpiece tray 130 on the workpiece motion stage 110, the separation measurement system 160 determines the position of the chip carrier 140. The workpiece motion stage 110 then transports one of the chips 150 to be picked up until it is situated above the vertical robotic arm 120. The vertical robotic arm 120 then moves upward to raise the chip 150, and at this time, a first one of the first bonding robotic arms 220 on the first motion stage 210 sucks up this first one of the chips 150 by vacuum, then the vertical robotic arm 120 returns to its original position.

After that, the first motion stage 210 rotates so that the first bonding robotic arm 220 moves to deliver the chip 150 to one of the measuring suckers 420. In the chip-up configuration, the third motion stage 410 may rotate clockwise to enable the measurement of the position of a mark on the chip 150 and the bonding between the chip 150 and the bonding substrate 320. Reference can be made to the description of Embodiment 1 about the chip bonding processes in chip-up configuration for details.

In the chip-down configuration, one of the first bonding robotic arms 220 moves to deliver the chip 150 to one of the measuring suckers 420. Specifically, as shown in FIG. 13, the third motion stage 410 rotates counterclockwise, the chip 150 is delivered from one of the measuring suckers 420 to the flipping robotic arm 170, and the pivotal arms 170a comprised in the flipping robotic arm 170 sucks the chip 150, wherein the surface of the chip 150 that is sucked has a mark thereon. Along with the pivoting of the pivotal arm 170a, the chip 150 is revolved with its orientation changed by 90° and delivered by the pivotal arm 170a to the other pivotal arm 170b comprised in the flipping robotic arm 170, wherein the surface of the chip 150 that is sucked has no mark. Along with the pivoting of the pivotal arm 170b, the chip 150 is revolved with its orientation changed by 90° and delivered to another one of the measuring suckers 420, and then the measuring sucker 420 delivers the chip 150 to one of the second bonding robotic arm 520. Whereafter, the second bonding robotic arm 520 moves to a working position that allows the chip-down alignment measurement system 470 to measure the position of the mark on the chip 150, and the measuring suckers 420 sucks the chip 150 which has been flipped over, and then the processes of measuring the position of the mark on the chip 150 and the processes of bonding the chip 150 to the bonding substrate 320 can be performed. Reference can be made to the description of Embodiment 1 about the chip bonding processes in chip-down configuration for details.

During the process of flipping over the chip 150, the time consumption in the actions that the pivotal arm 170a comprised in the flipping robotic arm 170 sucks up the chip from the measuring sucker 420 and pivots to deliver the chip to the other pivotal arm 170b, and the other pivotal arm 170b pivots to deliver the chip to another measuring sucker 420 may be several times the time consumption in the action that the measuring sucker 420 changes its position to where the adjacent one locates. In other words, the change of the position of the measuring sucker 420 may be done only once or repeated for several times during the process of flipping over the chip 150. Alternatively, the measuring suckers 420 may not move at all during this process.

According to this embodiment, the flipping robotic arm 170 does not require any additional vertical space and thus dispense with the need to expand the vertical dimension of the workpiece motion stage 110 or bonding stage 310. Instead, with the aid of the chip alignment unit 400, the flipping robotic arm can operate at more working positions to enable the first bonding robotic arm unit 200, the chip alignment unit 400 and the flipping robotic arm 170 to work in parallel, resulting in an increase in yield.

Based on the chip bonding apparatus according to this embodiment, chip bonding can be accomplished with a positional accuracy of 5.81 μm and a yield of 12924 uph per chip in the chip-up configuration, which are respectively increased by 28.36% and 5.67%, and with a positional accuracy of 5.34 μm and a throughout of 9364 uph per chip in the chip-down configuration, which are respectively increased by 12.75% and 8.90%, compared to the conventional equipment.

Embodiment 4

Referring to FIGS. 14 to 17, this embodiment differs from Embodiment 1 in that the chip bonding apparatus further includes a calibration measurement system 600 for measuring a reference mark on the third motion stage 410 and a mark on the bonding stage 310. According to this embodiment, only one such calibration measurement system 600 is included and disposed between adjacent two of the second bonding robotic arms 520. After the chip bonding apparatus has operated for a period of time, the calibration measurement system 600 may determine the coordinate position of the reference mark on the third motion stage 410, compare it with a previous coordinate position thereof, calculate out a shift between the two coordinate positions and feed back the shift. Similarly, it may determine the coordinate position of the mark on the bonding stage 310, compare it with a previous coordinate position thereof, calculate out a shift between the two coordinate positions and feed back the shift. According to the two shifts, the relative positions of chips can be corrected in the bonding processes, so that external impacts on position accuracy can be eliminated and thus the bonding accuracy can be improved.

Embodiment 5

Figure 18:
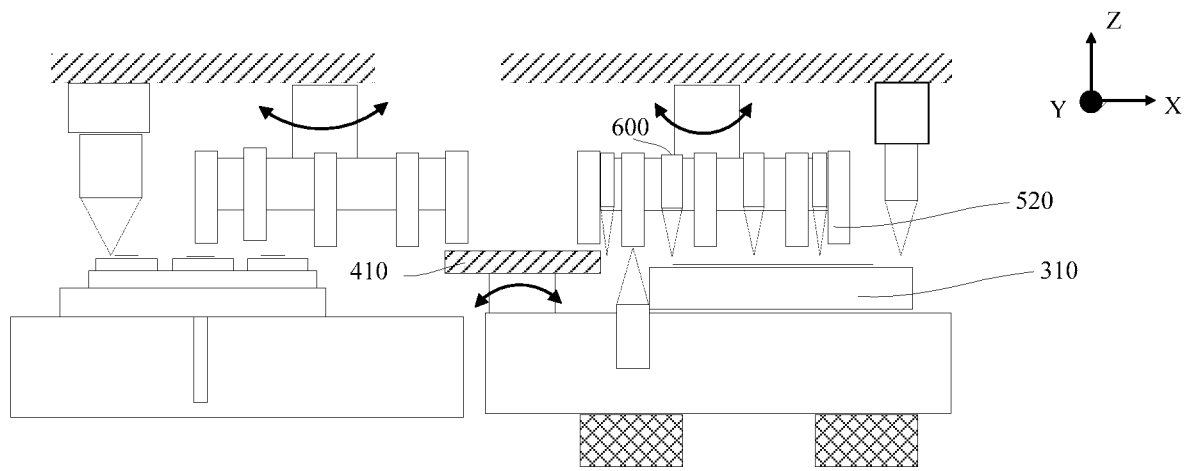
FIG. 18 is a front view of a chip bonding apparatus according to a fifth embodiment of the present disclosure.
Figure 19:
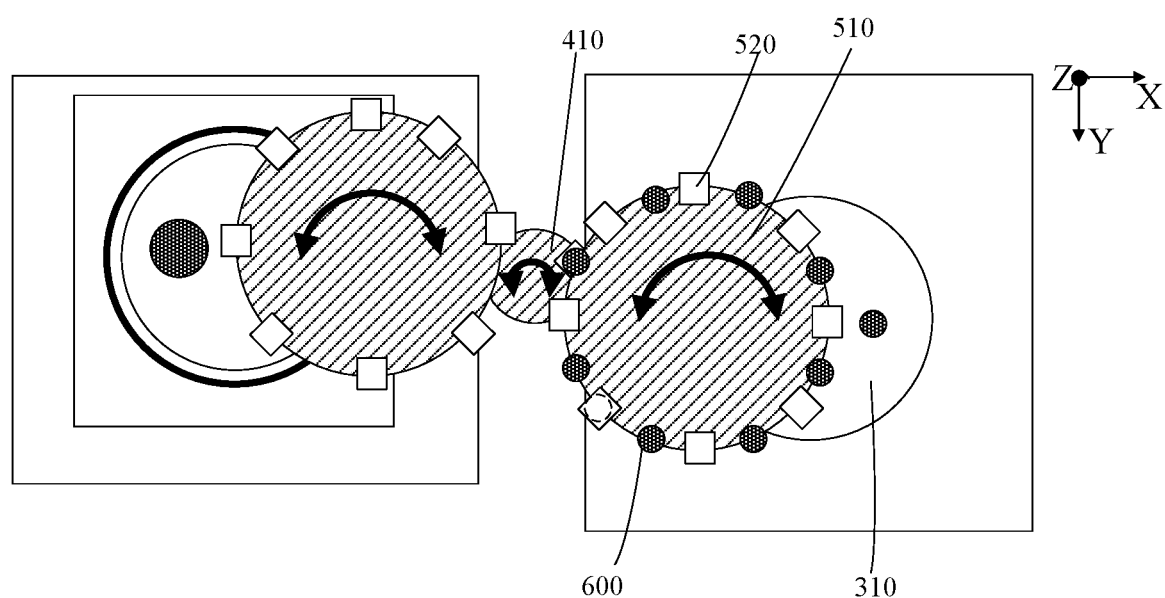
FIG. 19 is a top view of the chip bonding apparatus according to the fifth embodiment of the disclosure.

This embodiment differs from Embodiment 4 in that a plurality of calibration measurement systems 600 are included and the number of them is equal to that of the second bonding robotic arms 520. Referring to FIGS. 18 and 19, in the case that the number of the calibration measurement systems 600 is equal to that of the second bonding robotic arms 520, the calibration measurement systems 600 and second bonding robotic arms 520 may be alternately arranged on the second motion stage 510. In this case, the chip-up alignment measurement system 460 above the third motion stage 410 may be omitted, and the calibration measurement systems 600 may has the function of the chip-up alignment measurement system to measure the position of a mark on a chip mark while conducting calibration measurements to the third motion stage 410 and the bonding stage 310.

In summary, the chip bonding apparatus is capable of delivering chips in a continuous manner in which chip delivery, chip alignment and chip bonding can be performed simultaneously, resulting in time savings in the overall process cycle and an increase in yield; moreover, the chip bonding apparatus can bond chips to a single substrate in two modes that are chip-up mode and chip-down mode, which expends the scope of its applicability.

Those skilled in the art can make various modifications and variations to the present disclosure without departing from the spirit and scope thereof. Accordingly, the disclosure is intended to embrace all such modifications and variations if they fall within the scope of the appended claims and equivalents thereof.

What is claimed is:

1. A chip bonding apparatus, comprising:
    a chip separation unit;
    a chip alignment unit;
    a chip bonding unit; and
    a bonding robotic arm unit,
    wherein the bonding robotic arm unit comprises a first bonding robotic arm unit and a second bonding robotic arm unit;
    the first bonding robotic arm unit comprises a first motion stage, a first driver configured to drive the first motion stage, and at least one first bonding robotic arm which is arranged on the first motion stage and configured to suck up a chip from the chip separation unit and deliver the chip to the chip alignment unit;
    the second bonding robotic arm unit comprises a second motion stage, a second driver configured to drive the second motion stage, and at least one second bonding robotic arm which is arranged on the second motion stage and configured to suck up a chip from the chip alignment unit and deliver the chip to the chip bonding unit;
    wherein the chip alignment unit comprises a third motion stage and an alignment measurement system configured to measure a position of a mark on a chip;
    wherein the third motion stage at least comprises:
    a first part for receiving a chip delivered from the first bonding robotic arm;
    a second part for measuring, with the alignment measurement system, the position of the mark on the chip; and
    a third part for holding a chip which has been measured and is to be delivered by the second bonding robotic arm;
    wherein the first, second and third parts of the third motion stage are able to work simultaneously.

2. The chip bonding apparatus of claim 1, wherein the first motion stage is implemented as a rotary motion stage, the at least one first bonding robotic arm is arranged circumferentially on the rotary motion stage.

3. The chip bonding apparatus of claim 1, wherein the first motion stage is implemented as a pivotal arm having an output end at which the first bonding robotic arm is mounted.

4. The chip bonding apparatus of claim 3, wherein the pivotal arm is able to pivot in an X-Y plane.

5. The chip bonding apparatus of claim 1, wherein the second motion stage is implemented as a rotary motion stage, the at least one second bonding robotic arm is arranged circumferentially on the rotary motion stage.

6. The chip bonding apparatus of claim 1, wherein the chip alignment unit further comprises a third driver configured to drive the third motion stage and a plurality of measuring suckers arranged on the third motion stage.

7. The chip bonding apparatus of claim 6, wherein the alignment measurement system comprises a chip-down alignment measurement system and/or a chip-up alignment measurement system.

8. The chip bonding apparatus of claim 7, wherein the chip-down alignment measurement system is disposed under the second motion stage and configured to identify a position of a mark on a chip received by one of the at least one second bonding robotic arm from one of the measuring suckers.

9. The chip bonding apparatus of claim 7, wherein the chip-up alignment measurement system is disposed above the third motion stage and configured to identify a position of a mark on a chip on one of the measuring suckers.

10. The chip bonding apparatus of claim 7, wherein the chip bonding unit comprises a bonding stage, a bonding tray disposed on the bonding stage and configured to accommodate a bonding substrate, and a bonding measurement system configured to measure a position of the bonding substrate.

11. The chip bonding apparatus of claim 10, further comprising a calibration measurement system configured to measure a reference mark on the third motion stage and a bonding substrate mark on the bonding stage.

12. The chip bonding apparatus of claim 11, wherein only one calibration measurement system is included and disposed between adjacent two of the at least one second bonding robotic arm on the second motion stage; or the calibration measurement system is same as the at least one second bonding robotic arm in number, and the calibration measurement systems and the second bonding robotic arms are disposed alternately on the second motion stage.

13. The chip bonding apparatus of claim 12, wherein the chip-up alignment measurement system is integrated into the calibration measurement system, so that when moving to a position above one of the measuring suckers, the calibration measurement system acts as the chip-up alignment measurement system to identify a position of a mark on a chip on the measuring sucker.

14. The chip bonding apparatus of claim 6, wherein the third motion stage is implemented as a rotary motion stage, the measuring suckers are arranged circumferentially on the rotary motion stage.

15. The chip bonding apparatus of claim 1, wherein the chip separation unit comprises a workpiece motion stage, a workpiece tray disposed on the workpiece motion stage, a vertical robotic arm configured to separate a chip from the workpiece tray, and a separation measurement system configured to measure a position of the chip.

16. The chip bonding apparatus of claim 1, further comprising, when in a chip-down configuration, a flipping robotic arm configured to flip over a chip together with a mark thereon.

17. The chip bonding apparatus of claim 16, wherein the flipping robotic arm is implemented as a vertical flipping robotic arm that is disposed between the chip separation unit and the first bonding robotic arm and is configured to pick up a chip from the chip separation unit, flip the chip over and deliver it to the first bonding robotic arm.

18. The chip bonding apparatus of claim 16, wherein the flipping robotic arm comprises a pair of pivotal arms both disposed above the chip alignment unit, one of the pivotal arms configured to pick up a chip from the chip alignment unit and deliver it to the other pivotal arm, thereby flipping over the chip, the other pivotal arm configured to deliver the flipped chip to the chip alignment unit.

* * * * *